United States Patent [19]

Chandler et al.

[11] Patent Number: 5,303,123

[45] Date of Patent: Apr. 12, 1994

[54] RETAINER FOR REMOVABLE CIRCUIT BOARD COMPONENTS

[75] Inventors: Kirk R. Chandler, Garland; William C. Sherard, Jr., Richardson, both of Tex.

[73] Assignee: Alcatel Network Systems, Inc., Richardson, Tex.

[21] Appl. No.: 994,273

[22] Filed: Dec. 21, 1992

[51] Int. Cl.⁵ .......................................... H01R 23/68
[52] U.S. Cl. ................................. 361/785; 361/736; 361/761; 174/135
[58] Field of Search .............. 361/720, 736, 748, 761, 361/785; 174/135 L, 138 G; 211/41; 439/44, 64, 70, 72; 248/316.7; 24/548

[56] References Cited

U.S. PATENT DOCUMENTS

| | | | |
|---|---|---|---|
| H 498 | 7/1988 | Keller et al. | 361/404 |
| 5,218,518 | 6/1993 | Deinhardt et al. | 361/395 |
| 5,233,451 | 8/1993 | Iguchi | 359/88 |

FOREIGN PATENT DOCUMENTS 60-13373  7/1985  Japan ..................... 257/727

*Primary Examiner*—Leo P. Picard
*Assistant Examiner*—Young Whang
*Attorney, Agent, or Firm*—Baker & Botts

[57] ABSTRACT

A retainer for removable components that plug into a printed circuit board retains the removable component in an associated sockets on a printed circuit board. The retainer has the form of a clip including a retaining surface that applies a retaining force to the component. The retaining force is largely a spring force that directs the leads into the associated sockets by applying pressure to the top of the component. The retainer further has a positioning surface that positions the retaining surface in association with the component. This is done by the positioning surface engaging the exposed exterior surface of the associated sockets. A connecting surface connects the retaining surface to the positioning surface around the circuit board. In the preferred embodiment, the component is a crystal oscillator that plugs into the printed circuit board. Such crystal oscillators are removable to permit changing the operating frequency of an associated microwave transmission circuit.

8 Claims, 1 Drawing Sheet

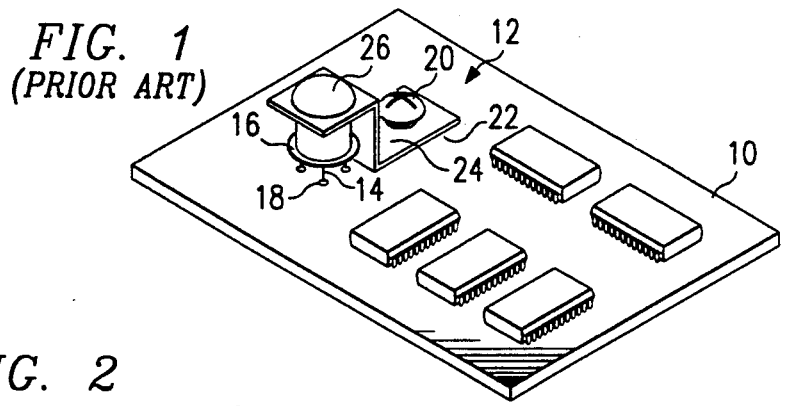
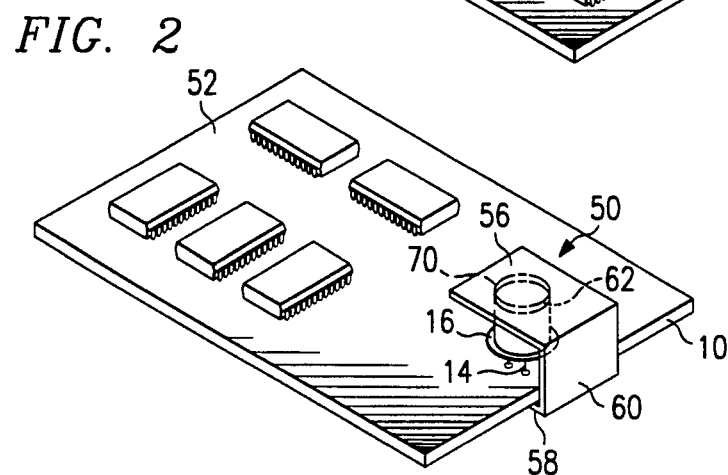
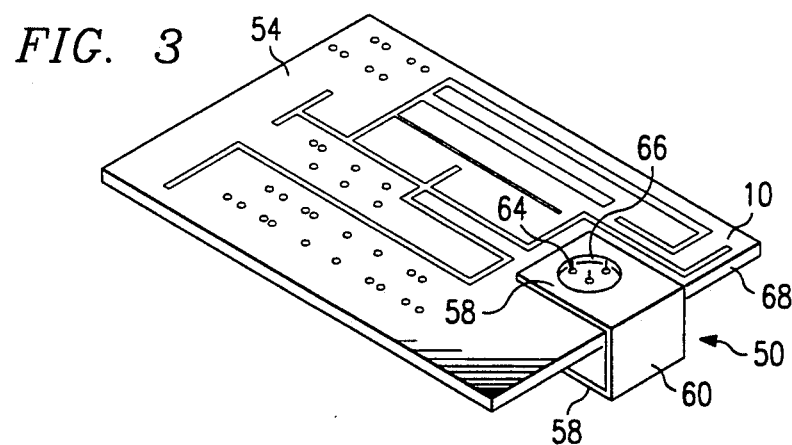
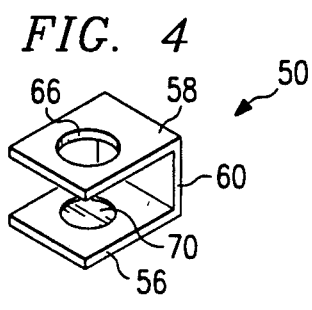 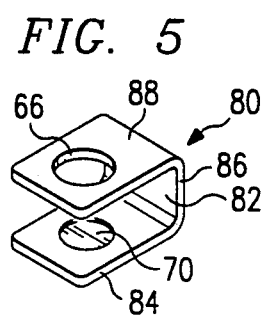 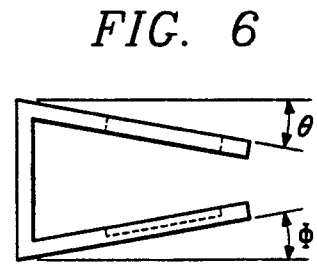

RETAINER FOR REMOVABLE CIRCUIT BOARD COMPONENTS

TECHNICAL FIELD OF THE INVENTION

The present invention relates generally to electronic circuit board devices and, more particularly, to devices for ensuring proper operation of components on printed circuit boards. Even more particularly, the present invention relates to a retainer for inexpensively retaining removable circuit board components in socket or receptacles on the circuit board.

BACKGROUND OF THE INVENTION

Microwave radiofrequency transmission devices are designed to operate at many different frequencies. The frequency for any microwave radiofrequency transmission device is largely a function of a crystal oscillator that provides a timing signal to the circuit. In many microwave circuits and within a relatively broad range of operation, it is possible to use the same basic circuitry to emit microwave signals having many different principal frequencies. Thus, by using different oscillators with the same basic circuitry it is possible to interchange crystal oscillators to have the circuit emit different microwave signals. Circuits with this flexibility use removable crystal oscillators that plug into sockets that are pre-positioned in the printed circuit board. This design is an economical and practical way to increase microwave module assembly flexibility.

A limitation, however, exists with this design. In most crystal oscillator designs, only three leads plug into three sockets of the circuit board. These three leads make a good connection with board circuitry when the crystal oscillator is fully positioned within the sockets, but may come loose and thereby disconnect the crystal oscillator. Once the crystal oscillator falls out of the circuit board, the microwave device becomes fully non-operational. It is an object of the present invention, therefore, to provide a way to retain the crystal oscillator in pre-positioned sockets of a circuit board.

There are known ways to retain removable crystal oscillators and other similar devices securely plugged into a circuit board. The conventional apparatus is a metal retaining arm device that includes a rubber pad or grommet to contact and direct the crystal oscillator into its socket. The metal retaining arm is screwed into the circuit board using a small screw.

Limitations with this design are numerous, but at least include the following problems. First of all, the metal retaining arm device comprises at least three parts. The first part is the metal retaining arm itself, the second is the rubber grommet, and the third is the fastening and positioning screw. For this device, the fastening and positioning screw must have a screwhole that is fabricated into the printed circuit board. The costs associated with this device include assembling the rubber grommet into the metal retaining arm, installing the screw in the circuit board, forming the screwhole within the circuit board, and positioning the metal retaining arm and rubber grommet over the crystal oscillator. Another limitation of the prior art metal retaining arm device is that the base of the retaining arm and the screwhole require circuit board space or "real estate" that could be used more effectively for other components or, similarly, could be avoided to make the circuit board smaller.

It is a further object of the present invention, therefore, to provide a retainer for a removable crystal oscillator or other component that significantly reduces the complexity of conventional devices.

It is yet another object of the present invention to avoid waste of circuit board real estate by removing from the circuit board the screwhole and avoiding the need for the space that accommodates the metal retaining arm.

It is, thus, an object of the present invention to provide a retainer that retains the leads of removable circuit board components such as a crystal oscillator in a plurality of associated sockets on the circuit board. This is done by the retainer having a retaining surface that applies a retaining force to the component. The retaining force includes a spring force that directs the plurality of leads into the associated sockets. A positioning surface on the retaining clip positions the retaining surface in association with the component by engaging the positioning surface with an exposed exterior surface of the associated sockets. A connecting surface connects the retaining surface with the positioning surface around the circuit board and assists in maintaining the retaining force against the component.

The retaining clip is made of an insulating material that has an elastic memory for constantly applying the retaining force against the component. Although the preferred embodiment of the retainer is a clip for retaining crystal oscillators on a circuit board, the retainer has many potential uses for any other components that plug into sockets on a circuit board.

BRIEF DESCRIPTION OF THE DRAWINGS

Other objects and advantages of the present invention will be apparent from a reading of the specification and appended claims in conjunction with the drawings, wherein:

FIG. 1 provides a simplified diagram of a conventional crystal oscillator retaining device;

FIGS. 2 and 3 provide perspective views of the retainer of the preferred embodiment to show, respectively, its positioning over a crystal oscillator and orientation with respect to the exterior sides of the sockets for the crystal oscillator;

FIG. 4 provides an inverted isometric view of the preferred embodiment; and

FIGS. 5 and 6 illustrate alternative embodiments of the present invention.

DETAILED DESCRIPTION OF THE INVENTION

In FIG. 1, on circuit board 10 is shown a typical metal retaining arm device 12 of the prior art to keep leads 14 of crystal oscillator 16 in associated sockets such as that designated by reference numeral 18. To retain crystal oscillator 16 in position during vibration or events that may cause crystal oscillator 16 to work its way out of sockets 18, metal retaining arm device 12 screws into circuit board 10 by screw 20 at circuit board portion 22 of metal retaining arm 24. Metal retaining arm 24 bends at the approximate height of crystal oscillator 16 and includes rubber pad 26 that engages and presses crystal oscillator leads 14 into sockets 18. This prior art embodiment is less than desirable. Its limitations include expense in manufacturing and installing metal retaining arm device 12, as well as the additional circuit board space necessary to accommodate the positioning of metal retaining arm 24 and machining of the circuit board 10 necessary to provide a hole for screw 20.

In FIG. 2, the preferred embodiment of the retainer 50 for removable circuit board components, is shown to overcome the limitations associated with the prior art. FIG. 2 shows a perspective view to illustrate top portion 52 circuit board 10, while FIG. 3 illustrates the engagement of retainer 50 to the bottom portion 54 of circuit board 10. As FIGS. 2 and 3 demonstrate, crystal retaining clip 50 includes retaining surface 56 that connects to positioning surface 58 through connecting surface 60. Retaining surface 56 applies a retaining force to the top 62 of crystal oscillator 16. This retaining force is a spring force that the material of retaining clip 50 possesses, i.e., is inherent in the material resilience of the material forming retainer 50. Retainer 50 is, in the preferred embodiment, formed of a nylon or LEXAN® material that has a good memory for its original shape. Thus, as a result of any distortion, retainer 50 seeks to return to its original shape.

FIG. 3 further illustrates the positioning of retainer 50 on circuit board 10. Each socket 18 has an exposed exterior surface 64 that protrudes from bottom side 54 of circuit board 10. Retainer 50 advantageously uses these exterior socket surfaces 64 by having a positioning hole 66 through positioning surface 58 that is sufficiently large to receive the exterior socket surfaces 64. This assures that, when clipped around printed circuit board edge 68, retainer 50 remains in position. To further maintain retainer 50 over oscillator 16, the preferred embodiment includes a recess 70 (see FIG. 2) that is sufficiently large to cover and receive top can portion 62. Therefore, with the combination of positioning hole 66 and recess 70, retainer 50 of the preferred embodiment maintains its position to engage and retain crystal oscillator leads 16 in sockets 18.

FIG. 4 shows more clearly retainer 50 of the preferred embodiment. FIG. 4 shows that retainer 50 is a single, solid structure having positioning hole 66 within positioning surface 58 and retaining recess 70 within retaining surface 56. Connecting surface 60 is integral to both positioning surface 58 and retaining surface 56 and assists to maintain a constant pressure on crystal oscillator 16. In the preferred embodiment, retainer 50 is either an extruded nylon or LEXAN® device for which retaining surface 56 and positioning surface 58 form right angles with connecting surface 60. It is clear that this one integral device is superior to the retaining arm of the prior art. First of all, only one single device is necessary for the preferred embodiment. This is in stark contrast to the several components necessary for the conventional metal retaining arm device 12 of FIG. 1. Additionally, installing retainer 50 is significantly simpler than installing metal retaining arm device 12. No retaining screw installation is necessary with the preferred embodiment. As long as crystal oscillator 16 may be placed sufficiently close to the periphery of circuit board 10, retainer 50 provides a solution that is easier to install, and more reliable than metal retaining arm device 12 or other similar conventional devices.

In FIG. 5, alternative embodiment 80 of the present invention shows a curved and continuous form of the retainer 50 of the present invention. Like the preferred embodiment retainer 50, alternative embodiment retainer 80 includes positioning hole 66 and retaining recess 70 both of which perform their above-stated functions. Instead of having distinct surfaces as in the preferred embodiment, alternative embodiment retainer 80 has continuous curved surface 82 that includes retaining portion 84 associated with retaining recess 70 flowing into a connecting portion 86. Connecting portion 86 flows into a positioning portion 88 having positioning hole 66. All of these portions form a continuous part that is a single retaining surface 82. An advantage of alternative embodiment 80 is that it may be easier to form as a flat surface that is cut and, then, cured to instill the necessary material memory to retain the original shape of retainer clip 80. A disadvantage of alternative retainer clip 80 is that, when installed, it may take up more room along the edge of circuit board 10 than the preferred embodiment retainer 50. This is due to the curved continuous form that alternative retainer 80 assumes.

In FIG. 6, another embodiment of the present invention appears. This embodiment has a form essentially similar to that of the preferred embodiment as shown in FIG. 4. The principal difference between the alternative embodiment of FIG. 6 and the preferred embodiment of FIG. 4 is that instead of positioning surface 58 and retaining surface 56 being at right angles to connecting surface 60, alternative embodiment 90 has positioning surface 58 at angle $\theta$ from the perpendicular and retaining surface 56 at angle $\Phi$ from the perpendicular. The purpose of these deflections is to increase the amount of retaining force that may be applied to crystal oscillator 16 to retain crystal oscillator leads 14 in socket 18 of circuit board 10. Variations on alternative embodiment 90 may include having angle $\theta$ or angle $\Phi$ equal zero, i.e., no deflection on one or the other surfaces.

OPERATION

The basic operation of the preferred embodiment retainer 50 is very straight forward once conceived and comprises placing retainer 50 over crystal oscillator 16 so that recess 70 engages oscillator top portion 62, while at the same time placing positioning hole 66 around socket exterior portions 64 on the bottom side 54 circuit board 10. With this installation, retainer 50 retains crystal oscillator 16 in sockets 18 even in the presence of the severe shock or continuous vibration.

It should be noted that operation of retainer 50 may also be extended to other pluggable components on printed circuit board 10. For example, if another component such as a plug-in resistor or capacitor or other similarly removable electronic or electrical devices are associated with circuit board 10, a similar device within the scope of the present invention may be used to retain the component in associated sockets such as sockets 18 of circuit board 10.

In summary, we have illustrated several embodiments of the inventive concept of a retainer for removable circuit board components for retaining a plurality of leads of a pluggable component of a pluggable component in a plurality of associated sockets on a printed circuit board that includes a retaining surface for applying a retaining force to the top of the component such that the retaining force has a spring force directing the plurality of leads into the associated sockets and further a positioning surface for positioning their retaining surface in association with the component by engaging the positioning surface with an exposed exterior surface of the associated sockets and, further, a connecting surface for connecting the retaining surface to the positioning surface around the circuit board and, further such that the retaining surface includes a recess for receiving and positioning the retaining surface over the removable component and the positioning surface includes a positioning hole for surrounding the exterior surface of the associated sockets.

As a result of the above, although the invention has been described with reference to the above embodiments, its description is not meant to be construed in a limiting sense. Various modifications of the disclosed preferred embodiment, as well as the alternative embodiments of the invention may make further embodiments apparent to a person skilled in the art upon reference to the above description. It is, therefore, contemplated that the appended claims will cover such modifications that fall within the true scope of the invention.

What is claimed is:

1. A circuit board retainer for retaining a plurality of leads of a pluggable component in a plurality of associated sockets on a circuit board, comprising:
   a retaining surface for applying a retaining force to the component, said retaining force comprising a spring force for directing the plurality of leads into the associated sockets;
   a positioning surface for positioning said retaining surface in association with a component by engaging said positioning surface with an exterior surface of each of said associated socket;
   a connecting surface for connecting said retaining surface to said positioning surface around said circuit board and generating from said connecting of said retaining surface with said position surface and said connecting surface.

2. A method for retaining a plurality of leads of a removable component in a plurality of associated sockets on a circuit board, comprising the steps of:
   applying a retaining force to the component using a retaining surface, said retaining force comprising a spring force for directing said plurality of leads into said plurality of associated sockets;
   positioning said retaining force according to the location of the component by engaging a positioning surface with an exterior surface of each of said plurality of associated socket; and
   connecting said retaining surface to said positioning surface using a connecting surface surrounding said circuit board said retaining force being generated by said connecting of said retaining surface with said positioning surface and said connecting surface.

3. A circuit board component retainer for retaining a plurality of leads of a removable component in a plurality of associated sockets on a circuit board, comprising:
   a retaining surface for applying a retaining force to the component, said retaining force comprising a spring force for directing the plurality of leads into the associated sockets said retaining surface comprising a recess for engaging and applying pressure to the component;
   a positioning surface for positioning said retaining surface in association with a component by engaging said positioning surface with an exterior surface of each of said associated socket said positioning surface comprising a positioning slot for receiving said exterior surfaces;
   a connecting surface for connecting said retaining surface to said positioning surface around said circuit board.

4. A method for retaining a plurality of leads of a removable component in a plurality of associated sockets on a circuit board, comprising the steps of:
   applying a retaining force to the component using a retaining surface, said retaining force comprising a spring force for directing the plurality of leads into said plurality of associated sockets said retaining surface comprising a recess for engaging and applying pressure to the component;
   positioning said retaining force according to the location of the component by engaging a positioning surface with a plurality of exterior surfaces of each of said plurality of associated socket said positioning surface comprising a positioning slot for receiving said exterior surfaces; and
   connecting said retaining surface to said positioning surface using a connecting surface surrounding said circuit board.

5. A circuit board retainer for retaining a plurality of leads of a removable component in a plurality of associated sockets on a circuit board, comprising:
   a retaining surface for applying a retaining force to the component, said retaining force comprising a spring force for directing the plurality of leads into the associated sockets;
   a positioning surface for positioning said retaining surface in association with a component by engaging said positioning surface with exterior surfaces of each of said associated socket;
   a connecting surface for connecting said retaining surface to said positioning surface around said circuit board; and
   said retaining surface, said positioning surface, and said connecting surface all comprising a continuous piece of insulating material having a memory for returning said retainer to an original after being distorted upon said retaining surface applying said retaining force and said positioning surface engaging said exterior surfaces.

6. A method for retaining a plurality of leads of a removable component in a plurality of associated sockets on a circuit board, comprising the steps of:
   applying a retaining force to the component using a retaining surface, said retaining force comprising a spring force for directing the plurality of leads into the associated sockets;
   positioning said retaining force according to the location of the component by engaging a positioning surface with an exposed exterior surface of said associated socket;
   connecting said retaining surface to said positioning surface using a connecting surface surrounding said circuit board; and
   said associating retaining surface, said positioning surface, and said connecting surface as a continuous piece of insulating material having a memory for returning said retainer to an original shape upon said retaining surface applying said retaining force and said positioning surface engaging said exterior surfaces.

7. A circuit board having the ability to retain a plurality of leads of a removable component in a plurality of associated sockets on said circuit board, comprising:
   a circuit board having a plurality of sockets for receiving a removable component;
   a retaining surface for applying a retaining force to the component, said retaining force comprising a spring force for directing the plurality of leads into the associated sockets;

a positioning surface for positioning said retaining surface in association with a component by engaging said positioning surface with exterior surfaces of each of said associated socket;

a connecting surface for connecting said retaining surface to said positioning surface around said circuit board; and said retaining surface, said positioning surface, and said connecting surface all comprising a continuous piece of insulating material having a memory for returning said retainer to an original after being distorted upon said retaining surface applying said retaining force and said positioning surface engaging said exterior surfaces.

8. A method for retaining a plurality of leads of a removable component in a plurality of associated sockets on a circuit board, comprising the steps of:

placing a removable component in a plurality of sockets of a circuit board;

applying a retaining force to the component using a retaining surface, said retaining force comprising a spring force for directing the plurality of leads into the associated sockets;

positioning said retaining force according to the location of the component by engaging a positioning surface with an exposed exterior surface of said associated socket;

connecting said retaining surface to said positioning surface using a connecting surface surrounding said circuit board; and said associating retaining surface, said positioning surface, and said connecting surface as a continuous piece of insulating material having a memory for returning said retainer to an original shape upon said retaining surface applying said retaining force and said positioning surface engaging said exterior surfaces.

* * * * *